(12) United States Patent
Ide et al.

(10) Patent No.: US 9,502,684 B2
(45) Date of Patent: Nov. 22, 2016

(54) ORGANIC ELECTROLUMINESCENCE DEVICE AND METHOD FOR MANUFACTURING THE SAME

(71) Applicant: Futaba Corporation, Chiba (JP)

(72) Inventors: Shinji Ide, Chiba (JP); Shigeyuki Ishiguro, Chiba (JP); Shigeo Naritomi, Chiba (JP); Nobuko Hayakawa, Chiba (JP)

(73) Assignee: Futaba Corporation, Chiba (JP)

( * ) Notice: Subject to any disclaimer, the term of this patent is extended or adjusted under 35 U.S.C. 154(b) by 0 days.

(21) Appl. No.: 14/562,407

(22) Filed: Dec. 5, 2014

(65) Prior Publication Data

US 2015/0162563 A1 Jun. 11, 2015

(30) Foreign Application Priority Data

Dec. 6, 2013 (JP) ................................. 2013-252976

(51) Int. Cl.
*H01L 33/00* (2010.01)
*H01L 21/00* (2006.01)
*H01L 51/52* (2006.01)
(Continued)

(52) U.S. Cl.
CPC ....... *H01L 51/5253* (2013.01); *H01L 27/3281* (2013.01); *H01L 27/3283* (2013.01); *H01L 51/5259* (2013.01); *H01L 51/56* (2013.01)

(58) Field of Classification Search
CPC ........... H01L 27/3281; H01L 51/5253; H01L 51/5259; H01L 51/56
USPC .............................................. 257/98; 438/29
See application file for complete search history.

(56) References Cited

U.S. PATENT DOCUMENTS

| | | |
|---|---|---|
| 2005/0116629 A1 | 6/2005 | Takamura et al. |
| 2006/0170340 A1 | 8/2006 | Tzen et al. |
| 2006/0220536 A1 | 10/2006 | Lan et al. |

(Continued)

FOREIGN PATENT DOCUMENTS

| | | |
|---|---|---|
| EP | 2151868 | 2/2010 |
| JP | A 08-315981 | 11/1996 |

(Continued)

OTHER PUBLICATIONS

European Patent Office, Application No. 14195840.5, Extended European Search Report dated May 27, 2015.
Japanese Patent Office, Application No. 2013-252976, Foreign Office Action dated Nov. 24, 2015.

*Primary Examiner* — David S Blum
(74) *Attorney, Agent, or Firm* — Wong & Rees LLP; Kirk D. Wong

(57) ABSTRACT

A highly reliable organic electroluminescence device and a manufacturing method includes at least one organic electroluminescence element, a structure, a to-be-covered portion and a passivation film. On a substrate, the organic electroluminescence element includes an anode, an organic layer including an organic light emitting layer, and a cathode. The structure is disposed on the substrate, and thickness of the structure is greater than that of the organic electroluminescence element. The to-be-covered portion is disposed at a step bottom portion of the structure and is formed such that the curvature radius of the cross-sectional shape of the to-be-covered portion at the step bottom portion is at least 0.3 micrometers. The passivation film covers the organic electroluminescence element, the structure and the to-be-covered portion.

17 Claims, 9 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 2007/0172971 A1* | 7/2007 | Boroson | H01L 51/5246 438/26 |
| 2009/0115318 A1 | 5/2009 | Gregory et al. | |
| 2010/0051992 A1 | 3/2010 | Kobayashi et al. | |

FOREIGN PATENT DOCUMENTS

| | | |
|---|---|---|
| JP | 2003-045668 | 2/2003 |
| JP | 2003-045669 | 2/2003 |
| JP | 2010-055795 | 3/2010 |
| JP | 2013-097917 | 5/2013 |
| WO | WO02/089210 | 11/2002 |

* cited by examiner

ORGANIC ELECTROLUMINESCENCE DEVICE AND METHOD FOR MANUFACTURING THE SAME

CROSS-REFERENCE TO RELATED APPLICATION

This U.S. Non-Provisional patent application claims the benefit of Japanese Patent Application No. 2013-252976, filed on Dec. 6, 2013, the entire disclosure of which is incorporated by reference herein.

TECHNICAL FIELD

The present disclosure relates to an organic electroluminescence device (organic light emitting device (OLED)) and a manufacturing method thereof.

BACKGROUND ART

An organic electroluminescence device such as an organic electroluminescence display and the like has low environmental resistance such as moisture resistance and the like. Thus, when an organic electroluminescence device is manufactured, it is important to protect the device from the surrounding environment such as air. Methods of protection from the surrounding environment include covering the organic layer of the organic electroluminescence device by hollow hermetic sealing, filled hermetic sealing, solid hermetic sealing, and the like, or further, forming a passivation film on the organic layer before sealing of the organic layer in order to protect the organic layer from chemical components in a desiccant or adhesives, or permeation by moisture over an extremely long time.

For example, Patent Literature 1 discloses an organic electroluminescence device having a structure in which a passivation film is formed at the overhang part of a cathode separator. The passivation film is formed in a film forming method that readily allows enveloping deposition, such as the CVD (Chemical Vapor Deposition) and sputtering. However, it is actually difficult to form a precise passivation film in the lower acute angle part of the overhang part or the like in the method of the Patent Literature 1. As the Patent Literature 2 describes, such difficulty is due to ready generation of defects such as cracks in the passivation film at the lower part of the overhang part.

As a method for improving the coatability of a passivation film, Patent Literature 2 discloses a method that forms an organic layer and then uses a resin for planarization of an overhang part.

CITATION LIST

Patent Literature

Patent Literature 1: Unexamined Japanese Patent Application Kokai Publication No. H08-315981
Patent Literature 2: Unexamined Japanese Patent Application Kokai Publication No. 2013-97917.

SUMMARY OF INVENTION

Technical Problem

However, because the overhang part is planarized by resin after forming an organic layer as a film, considering the influence to the organic layer, the method of Patent Literature 2 has a problem in that the utilized materials, manufacturing processes, manufacturing temperatures and the like are limited, and the method lacks versatility. Moreover, it is sometimes difficult to provide a highly reliable organic electroluminescence device due to restrictions of the utilized material and the like.

The present disclosure was made in consideration of the above mentioned problem, and an objective of the present disclosure is to provide a highly reliable organic electroluminescence device and the method for manufacturing the same.

Moreover, another objective of the present disclosure is to provide a versatile organic electroluminescence device and a method for manufacturing the same.

Solution to Problem

In order to achieve the above mentioned objective, the organic electroluminescence device of the first aspect of the present disclosure includes:

a substrate;

at least one organic electroluminescence element thereon including an anode, an organic layer including an organic light emitting layer, and a cathode;

a structure disposed on the substrate, the structure being thicker than the organic electroluminescence element;

a to-be-covered portion disposed at a step bottom portion of the structure and formed such that the curvature radius of the cross-sectional shape of the to-be-covered portion at the step bottom portion is at least 0.3 micrometers; and a passivation film covering the organic electroluminescence element, the structure and the to-be-covered portion.

Preferably, the organic electroluminescence device further includes:

a sealing plate or a sealing film that seals the organic electroluminescence element; and a filled and sealed structure, in which a desiccant is filled, pasted between the organic electroluminescence element and the sealing plate or the sealing film, or a solid sealed structure in which the entire surface of the sealing plate or the sealing film is pasted using an adhesive.

The to-be-covered portion, for example, is a material composing the organic electroluminescence element.

The to-be-covered portion, for example, is a material composing the hole transporting layer or the hole injection layer of the organic electroluminescence element.

Preferably, the organic electroluminescence device is a passive-matrix type display;

the structure is a cathode separator and has an overhung portion; and the to-be-covered portion is a material composing the hole transporting layer or the hole injection layer of the organic electroluminescence element.

Preferably, the structure is a cathode separator and has an overhung portion; and the to-be-covered portion is a positive photoresist material.

A method for manufacturing an organic electroluminescence device of the second aspect of the present disclosure is a method for manufacturing an organic electroluminescence device including a substrate, at least one organic electroluminescence element thereon including an anode, an organic layer including an organic light emitting layer, and a cathode;

the method including:

an anode forming process including forming an anode at a predetermined location on the substrate;

a structure forming process including forming a structure, whose film thickness is thicker than the organic electroluminescence element, at a predetermined location on the substrate;

a to-be-covered portion forming process including forming a to-be-covered portion at a step bottom portion of the structure such that the curvature radius of the cross-sectional shape of the to-be-covered portion at the step bottom portion is at least 0.3 micrometers;

an organic electroluminescence element forming process including forming an organic electroluminescence element by forming an organic layer and a cathode on the anode; and a passivation film forming process including forming a passivation film that covers the organic electroluminescence element, the structure and the to-be-covered portion.

Preferably, the organic layer includes at least one of a hole injection layer and a hole transporting layer, and the to-be-covered portion forming process includes:

by film forming, heating and flowing a hole injection material and/or a hole transporting material, forming at least one of a hole injection layer and a hole transporting layer in conjunction with forming the to-be-covered portion at the step bottom portion of the structure.

Preferably, the forming of the to-be-covered portion at the step bottom portion of the structure in the to-be-covered portion forming process includes applying a positive resist and exposing the whole surface.

Advantageous Effects of Invention

According to the present disclosure, a highly reliable organic electroluminescence device and the manufacturing method thereof can be provided.

DESCRIPTION OF EMBODIMENTS

Figure 1:
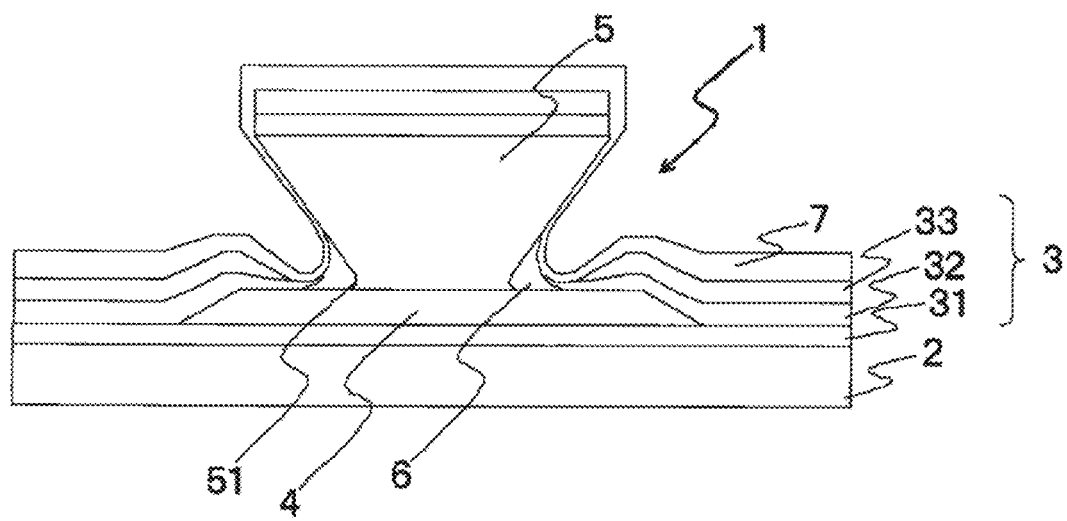
FIG. 1 is an explanatory drawing showing an example of the cathode separator adjacent area of an organic electroluminescence device according to the present disclosure.

Hereinafter, the organic electroluminescence device (organic EL device) and its manufacturing method according to the present disclosure are described in reference to the drawings. An example according to the present embodiment is explained in which a passive-matrix type organic electroluminescence display (PMOLED) is manufactured as the organic EL device 1. FIG. 1 is a diagram showing an example of the organic EL device according to the present disclosure.

As shown in FIG. 1, the organic EL device 1 includes a substrate 2, at least one organic EL element 3, an insulating film 4, a structure 5, a to-be-covered portion 6, and a passivation film 7.

The substrate 2 is preferably formed of a transparent or translucent material, for example, formed of a glass plate, a transparent plastic sheet, a translucent plastic sheet, quartz, transparent ceramics, or a composite sheet combining these materials.

An organic EL element having a desired structure and shape and formed by the normal manufacturing process of an organic EL element is used as the organic EL element 3, which includes the anode 31, at least one organic layer 32, and the cathode 33.

The anode (lower electrode) 31 is connected to an external power source (not shown) and has a function of providing holes to the organic layer 32. The anode 31 is formed of a transparent material, and metal, alloy or an electrically conductive compound having a relatively large work function is preferably used for an electrode material for the anode 31. The electrode material used for the anode 31 is exemplified by gold, platinum, silver, copper, cobalt, nickel, palladium, vanadium, tungsten, tin oxide, zinc oxide, indium-tin-oxide (ITO), and indium-zinc-oxide (IZO).

The organic layer 32 includes an organic light emitting layer. The organic light emitting layer is a layer that includes a compound having a function that injects a hole and an electron, a transporting function thereof, and a function generating excitons by the recombination of holes and electrons (light emitting function). Materials used for the organic light emitting layer include coumalin derivatives, quinacridone, rubrene, styryl type dyes, quinoline derivatives such as organic materials having a quinolinol ring such as tris(8-quinolinolato)aluminum or organic metal complexes in which organic material having a quinolinol ring is coordinated, tetraphenylbutadiene, anthracene derivatives, naphthacene derivatives, perylene, coronene, 12-phthaloperynone derivatives, phenyl anthracene derivatives, tetraarylethene derivatives, fluoranthene derivatives, acenaphthofluoranthene derivatives, and aromatic amine compounds such as tetraphenyldiaminobiphenyl derivatives (TPD), triarylamine derivatives and the like.

The organic layer 32 may include a hole transporting layer, a hole injection layer, an electron transporting layer and an electron injection layer. The hole injection layer is a layer including a compound that has a function that promotes injection of holes from the anode 31. An aromatic amine compound or the like, for example, is used for the hole injection layer. The hole transporting layer is a layer including a functional compound that conveys the injected hole. Tetraphenyldiaminobiphenyl derivatives (TPD) or the like, for example, are used for the hole transporting layer. Moreover, the electron-transporting layer includes a compound that has a function that promotes injection of electrons, and the electron-transporting layer includes a functional compound that conveys the injected electron.

The cathode 33 (upper electrode) is connected to an external power source (not shown) and provides electrons to the organic layer 32. Metal, alloy or an electrically conductive compound having a relatively small work function is preferably used for an electrode material for the cathode 33. The electrode materials used for the cathode 33 are, for example, lithium, lithium-indium alloy, sodium, calcium, magnesium, magnesium-silver alloy, magnesium-indium alloy, indium, ruthenium, titanium, manganese, yttrium, aluminum, aluminum-lithium alloy, aluminum-calcium alloy, aluminum-magnesium alloy, graphite thin films and the like. These electrode materials can be used as a single material, or multiple materials can be used in combination.

The insulating film 4 is formed on the substrate 2, and covers the stepped pattern of the anode 31 and/or a wiring film for which exposure is undesirable, as exemplified by a Molybdenum Aluminum Molybdenum (MAM) wiring film composed of a laminated film of Mo (molybdenum) alloy/Al (aluminum) alloy/Mo alloy. Photosensitive materials, such as photosensitive polyimide resins, novolac type photoresists, photosensitive acrylic resins, and photosensitive cycloolefin resins, are preferably used for the insulating film 4. Moreover, the insulating film 4 may be patterned using photoresist after film formation using a non-photosensitive polyimide resin, oxidized silicon, silicon oxynitride or silicon nitride.

The structure 5 is formed on the insulating film 4. The structure 5 is arranged between the organic EL elements 3 so as to protrude from the substrate 2, and functions as a cathode separator, a spacer, a rib, and the like. The structure 5, for example, has an approximately trapezoidal cross-sectional shape whose upper base is larger than the lower base, and the structure 5 is formed using organic resin such as a photosensitive resin. When the organic EL device 1 is a passive-matrix type organic EL display, the structure 5 acts as a cathode separator, which is an element-separating structure that separates the cathode electrodes of adjacent elements.

Figure 2:
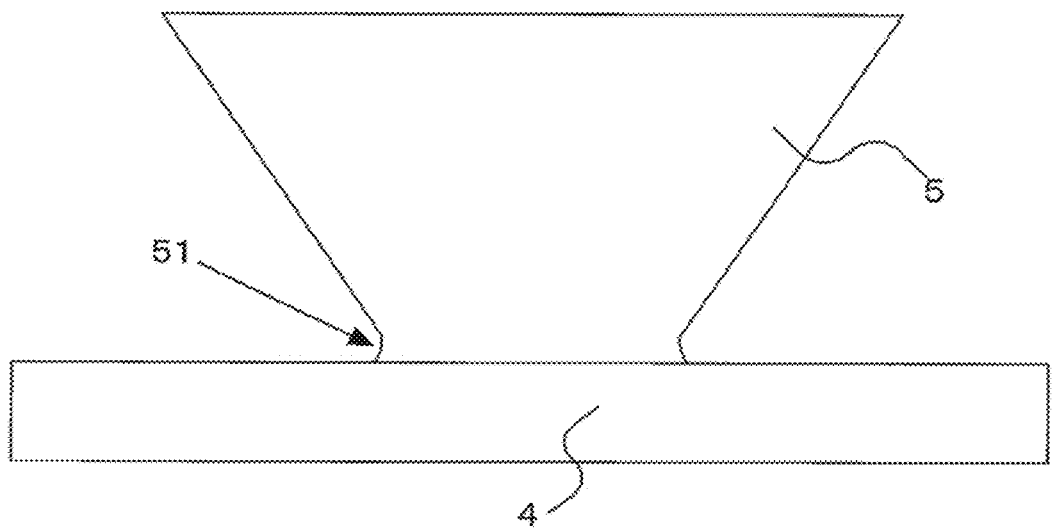
FIG. 2 is an explanatory drawing for explaining the step bottom portion on which a to-be-covered portion is not formed.
Figure 3:
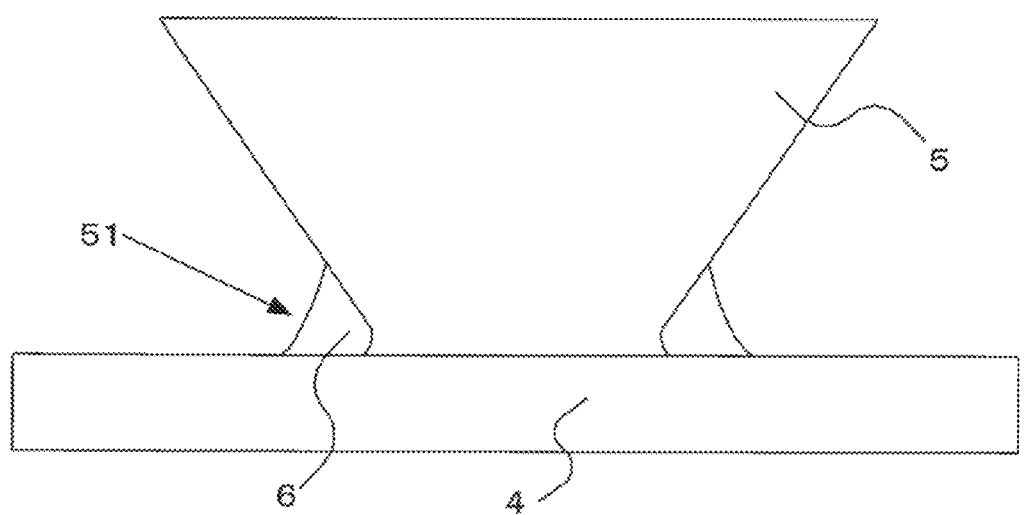
FIG. 3 is an explanatory drawing for explaining the step bottom portion on which the to-be-covered portion is formed.

The to-be-covered portion 6 is disposed at a portion (step bottom portion) 51 at which a step of the structure 5 and the thin film immediately therebelow contact one another. As shown in FIG. 2, in a state in which the to-be-covered portion 6 is not disposed, the curvature radius of the step bottom portion 51 of the structure 5 is very small, i.e. about 0.2 micrometers. If the organic layer 32, the cathode 33, and the passivation film 7 are formed in this state, those films become very fragile in the step bottom portion 51 of the structure 5. In this state, if a sealing plate having adhesive applied to the whole surface thereof is pasted, or if a sealing plate having adhesive applied to the perimeter thereof is pasted, the center of the sealing plate being filled by a liquid desiccant, defects such as cracks can occur at the step bottom portion 51, or the adhesive or the liquefied desiccant can seep into the organic EL element 3. For this reason, as shown in FIG. 3, the to-be-covered portion 6 is formed so that the curvature radius of the cross-sectional shape at the step bottom portion 51 is increased. Cross-sectional shape of the to-be-covered portion 6 is formed so that the curvature radius at the step bottom portion 51 of the structure 5 is at least 0.3 micrometers (0.3 micrometers or more), because, if the to-be-covered portion 6 is formed so that the curvature radius of the cross-sectional shape at the step bottom portion 51 is 0.3 micrometers or more, coatability by the passivation film 7 improves, and the step bottom portion 51 becomes resistant to the generation of defects such as cracks.

The to-be-covered portion 6 can be formed using organic materials such as generally used photosensitive resins.

The to-be-covered portion 6 is preferably formed of a material composing the organic EL element 3, and most preferably, of a material composing the hole transporting layer or hole injection layer of the organic EL element 3. Moreover, the to-be-covered portion 6 can be formed of positive type photoresist material. By using such materials, the to-be-covered portion 6 can be formed before or during film forming of the organic layer 32 of the organic EL element 3, and a versatile and highly reliable organic EL device 1 can be formed.

The passivation film 7 is formed on the structure 5, on the to-be-covered portion 6, and on the organic EL element 3. The passivation film 7 is composed of one layer or a plurality of layers, and includes at least an inorganic film. The inorganic film is exemplified by films mainly composed of inorganic materials such as silicon oxide film, silicon oxynitride film, silicon nitride film, alumina, magnesium oxide, or the like.

In addition, a liquefied, gelled or flexible solid layer having a drying function is preferably pasted on the passivation film 7. Preferably, further on the liquefied, gelled or flexible solid layer, a sealing plate is pasted to which an adhesive is applied, or a sealing plate is pasted, having adhesive applied to the perimeter thereof, and a liquid desiccant is used to fill the center.

Next, the manufacturing method of the organic EL device 1 configured in this manner is explained.

First, the substrate 2 is prepared. Then, on the prepared substrate 2, an Indium Tin Oxide (ITO) film is formed as an anode material by, for example, sputtering. Then an anode pattern is formed using the photolithographic method (hereinafter, referred to as the photolithography method). An anode 31 is thereby formed on the substrate 2. Subsequently, the wiring pattern (not shown) for connecting the anode 31 and an external circuit is formed. In addition, film forming methods, such as the vacuum film-forming method generally used for organic electroluminescence displays and liquid crystal displays, and processing methods such as the photolithography method can be used for each formation process. No particular industrial method is necessary.

Then the insulating film 4 is formed by application of photosensitive polyimide resin, for example, on the stepped pattern of the anode 31 and/or the wiring film whose exposure is undesirable. Subsequently, the structure 5, having an approximately trapezoidal cross-sectional shape, is formed on the insulating film 4 from photosensitive resin.

Because the organic layer 32 and the cathode 33 of the organic EL element 3 are very sensitive to moisture, after these films are formed, the unprotected films forming these elements cannot be exposed to air. That is, because the general photolithography method is inapplicable of patterning the cathode 33, electrical insulation between adjacent elements must be formed simultaneously with the film formation of the cathode 33. Therefore, a film forming method having poor step coverage is selected as the method of film formation of the cathode 33, and the technique is used of separating elements simultaneously with cathode 33 film formation by adoption of a shape for the structure 5 that is difficult to cover.

After forming the structure 5, positive resist is applied, and the entire surface is exposed and developed. Although almost all resist is removed at the time of development, the resist under the overhang part of the structure 5 is insufficiently exposed, and some resist remains in the bottom acute angle part of the overhang part. This forms the to-be-covered portion 6 at the step bottom portion 51.

In order to form the to-be-covered portion 6, after forming the structure 5, the hole injection material or hole transportation material film may be formed and then heated. In this case, the heated hole injection material or hole transportation material flows, and creeps up to the bottom acute angle part of the overhang part due to surface tension. This forms the to-be-covered portion 6 at the step bottom portion 51. In addition, both of polymer type materials and low molecular weight type materials can be used for the hole injection material or the hole transportation material. The polymer system hole injection material/hole transportation material is applied to form the to-be-covered portion 6 by dissolving the material in a solvent and then using a printing process, ink-jet method, or the like. This method is different from the common polymer material forming method in that these materials must be applied in such a manner that the materials reach the overhang bottom acute angle part. Generally the polymer type material is formed so as not to reach the upper surface of the insulating film 4

After completion of formation of the organic layer 32, the cathode 33 is formed. Furthermore, an inorganic film such as, for example, a silicon oxide film is formed, and the passivation film 7 is formed such that the structure 5, the to-be-covered portion 6, and the organic EL element 3 are covered. In addition, a liquefied, gelled or flexible solid layer having a drying function may be formed on the passivation film 7. Further upon the liquefied, gelled or flexible solid layer, a sealing plate, to which adhesive is applied, can be pasted, or a sealing plate can be pasted, having adhesive applied to the perimeter thereof, and having the center thereof filled by liquid desiccant.

The-covered portion 6 is formed such that the curvature radius of the cross-sectional shape at the step bottom portion 51 becomes large in the organic EL device 1 manufactured in this way. Thus, the coatability of the passivation film 7 improves, and defects such as cracks become hard to generate at the step bottom portion 51. For this reason, a highly reliable organic EL device 1 can be provided.

Moreover, the to-be-covered portion 6 can be formed before or during film forming of the organic layer 32 of the organic EL element 3. Thus, a versatile and highly reliable organic EL device 1 can be formed.

Although the above-mentioned embodiment explains an example in which a passive-matrix type organic electroluminescence display (PMOLED) is manufactured, the organic EL device 1 of the present disclosure is not be limited to the manufacture of this type of display, and can be applied, for example, to the manufacture of an active-matrix type organic electroluminescence display (AMOLED) and organic EL lighting. No separator is required in this case. However, when the distance to the sealing plate needs to be fixed, pillar-shaped spacers using photoresist or the like can be used. Such usage avoids direct contact between the organic EL element 3 and the sealing plate, and also reduces the possibility of the occurrence of a defect when an extremely small particle becomes caught between the organic EL element 3 and the sealing plate. Moreover, the combined use of the sealing plate as a color filter has effects such as keeping the distance between the organic EL element 3 and the color filter fixed and keeping coloring fixed within the surface of the display panel.

In contrast to the cathode separator, the spacer can have an upwardly tapered shape so that defects tend not to readily occur, although the angle of the upwardly tapered shape cannot be too small. This is because, if the upward tapered angle is small, the spacer bottom area becomes large, and increase of the aperture ratio of the pixel becomes difficult. Polymer type hole injection material is effective for increasing the curvature radius of the spacer bottom step. If the device is an AMOLED, the organic layer 31, a transparent or translucent electrode, and the passivation film 7 are formed, and a sealing plate on which the color filter, for example, is formed, is pasted with an adhesive. Adhesive can be also be applied to the edge of the sealing plate, and the sealing plate can be attached while using a liquid desiccant to fill the gap with the element. During attachment, the sealing plate and the array substrate should be compressed to keep the distance therebetween uniform. The AMOLED made in this way displayed very good display characteristics and reliability. On the other hand, when the process of increasing the curvature radius of the step bottom portion is not performed, cracking sometimes occurs in the step bottom portion during pasting together of the substrate 2 and the sealing plate. Adhesive or liquefied desiccant sometimes seeps into the organic EL element 3 at the cracks, and this sometimes causes defects.

EXAMPLES

Hereinafter, specific examples of the present disclosure are shown, and the present disclosure is explained further in detail.

Example 1

This example explains a case in which the passive-matrix type organic electroluminescence display (PMOLED) is manufactured as the organic EL device 1.

First, an alkali-free glass substrate was prepared as the substrate 2. Then, on the prepared substrate 2, an ITO film was formed as an anode material, for example, by sputtering, and then, an anode pattern was formed by the photolithography method. Subsequently, as a wiring metal, a laminated film of Mo (molybdenum) alloy/Al (aluminum) alloy/Mo alloy (Molybdenum Aluminum Molybdenum (MAM) wiring film) was continuously formed by sputtering without breaking a vacuum, and further, a wiring pattern connecting the anode and a driver IC was processed similarly by the photolithography method.

Figure 4:
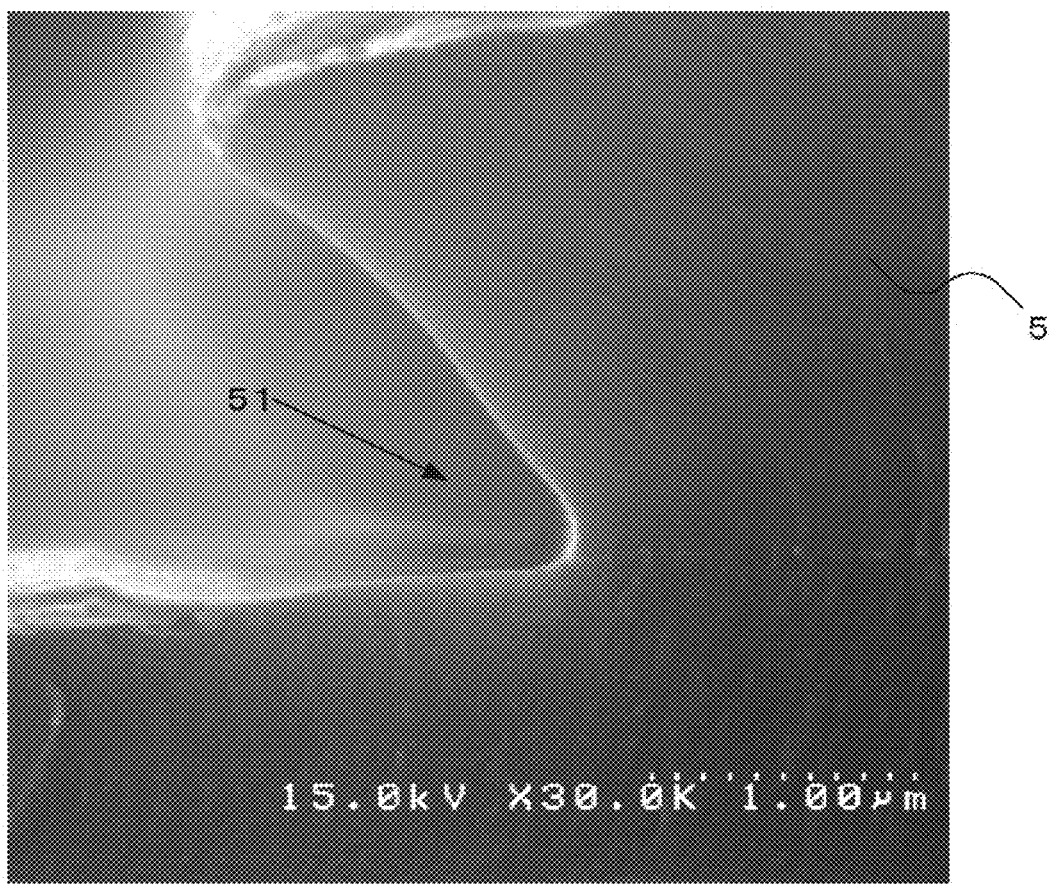
FIG. 4 is a figure showing a cross-sectional SEM image of the step bottom portion on which the to-be-covered portion of Example 1 is not formed.

Then, the insulating film 4 was formed on the stepped pattern of the anode 31 and the MAM wiring film, for which exposure was undesirable, by application of photosensitive polyimide resin. Subsequently, the structure 5, whose cross-sectional shape is approximately trapezoidal, was formed on the insulating film 4 using photosensitive resin. FIG. 4 shows a SEM image of the cross section of the step bottom portion 51 in the state in which the to-be-covered portion 6 is not formed.

After the structure 5 was formed, positive resist was applied, and further, the whole resist surface was exposed and developed. The positive resist material under the overhang part of the structure 5 was difficult to sufficiently illuminate by light during exposure of the whole resist surface. Thus, the positive resist remained at the step bottom portion 51, which is the innermost part of the overhang part, by appropriate selection of exposure/development conditions. Then, the to-be-covered portion 6 was formed at the step bottom portion 51 by annealing and curing the positive resist.

Figure 5:
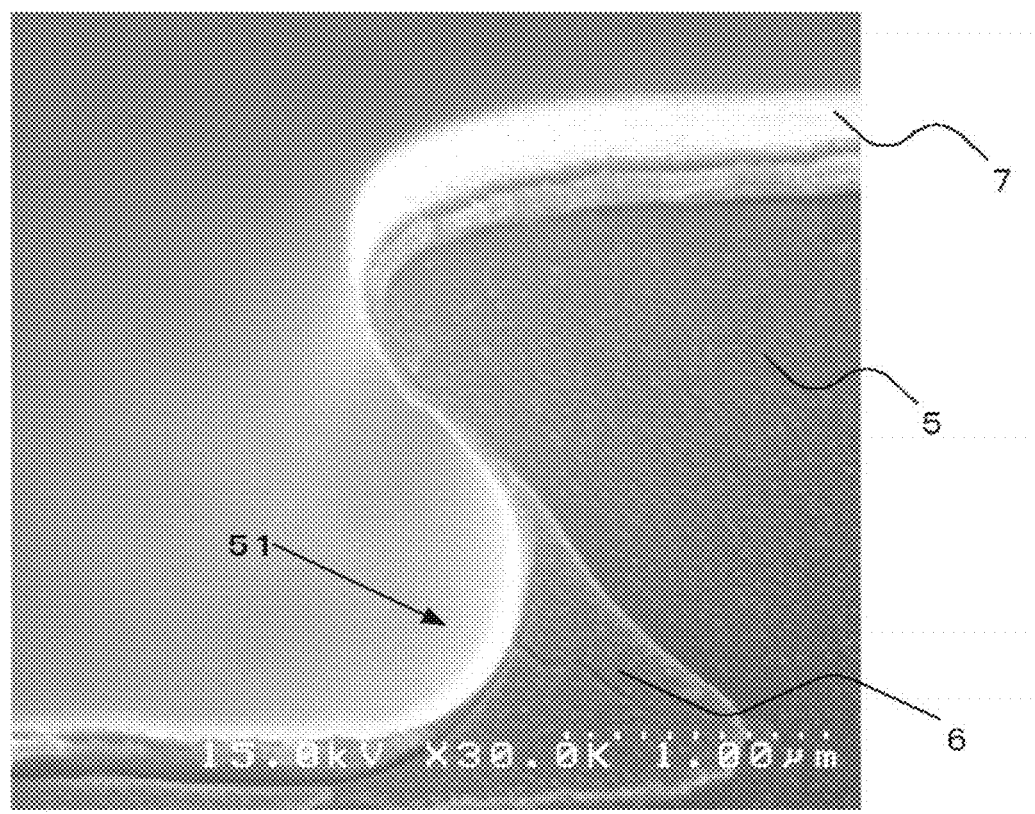
FIG. 5 is a figure showing a cross-sectional SEM image of the step bottom portion on which the to-be-covered portion of Example 1 is formed.

Then, the passivation film 7 was formed to cover the structure 5, the to-be-covered portion 6 and the organic EL element 3. FIG. 5 shows the SEM image of the cross section of the step bottom portion 51 in the state in which the passivation film 7 has been formed. As shown in FIG. 5, the to-be-covered portion 6 was formed such that the step bottom portion 51 has a gentle curvature radius, and it was confirmed that the passivation film 7 covers the structure 5 completely.

Finally, the PMOLED glass panel (organic EL device 1) was completed by pasting the sealing plate, dicing the substrate 2 into individual pieces and mounting the IC and a flexible printed circuit board.

It was observed that, in the organic EL device 1 of Example 1, the to-be-covered portion 6 was formed at the step bottom portion 51 of the structure 5, the passivation film 7 completely covered the structure 5, seepage of adhesive or liquid desiccant into the organic EL element 3 improved remarkably, and such performance of the organic EL device 1 was confirmed to be at a level satisfactory for practical use.

Example 2

In Example 2, the anode 31, the insulating film 4, and the structure 5 were formed on the substrate 2 in the same manner as in Example 1.

After forming the structure 5, a polymer type hole injection layer was applied up to the step bottom portion 51. Generally, the processing of a normal polymer type hole injection layer includes forming an insulation film (termed a "blank"); forming holes in the insulation film in portions used for forming pixels, to expose the anode; and applying the polymer type hole injection layer only to the aperture portions by the ink-jet method and the like. Processing of the resin surface such as the blank using fluorine or the like so as to repel the hole injection layer material is a technique that is used so that the hole injection material readily gathers only on the surface of the anode.

However, in Example 2, the hole injection layer material was applied and dried after leakage characteristics and compatibility with the hole injection layer material were improved by plasma treatment of the insulation film 4 and the structure 5. This caused the hole injection material to also remain at the step bottom portion 51 of the structure 5, and the curvature radius of the step bottom portion 51 could be increased.

Finally, in the same manner as in Example 1, a PMOLED (organic EL device 1) was completed by the consecutive steps of forming the organic layer 32, the cathode 33, and the passivation film 7, and then pasting a sealing plate.

It was observed also in the organic EL device 1 of the Example 2 that the to-be-covered portion 6 was formed at the step bottom portion 51 of the structure 5, the passivation film 7 completely covered the structure 5, seepage of adhesive or liquid desiccant into the organic EL element 3 improved remarkably, and such performance of the organic EL device 1 was at a level sufficient for use without problems in practice.

Example 3

First, PET film was temporarily fixed as the substrate 2 on a support plate, such as glass, and acrylic resin was applied to the surface as a hard coat layer. Furthermore, silicon oxynitride film was formed by the plasma CVD method as a moisture permeation prevention film, on which, in the same manner as in Example 1, Indium Tin Oxide (ITO) film was formed by the sputtering method as an anode material. Then an anode pattern was formed by the photolithography method. Subsequently, as a wiring metal, a laminated film of Mo (molybdenum) alloy/Al (aluminum) alloy/Mo alloy (MAM wiring film) was consecutively formed using the sputtering method without breaking vacuum. Furthermore, a wiring pattern for connecting the anode and driver IC was produced in a similar manner using the photolithography method.

Thereafter, the stepped pattern of the anode 31 and the MAM wiring film, whose exposure would be undesirable, were covered with an insulation film. Novolac type photoresist was used for this insulation film. Thereafter on the insulation film 4, photosensitive resin was used to form the structure 5, whose cross-sectional shape was approximately a trapezoid. The structure 5 on the insulation film was formed using negative resist. Each process may be performed by methods generally used for processing of organic EL displays or liquid crystal displays, as long as temperature is in a range in which the PET film is not damaged.

Figure 6:
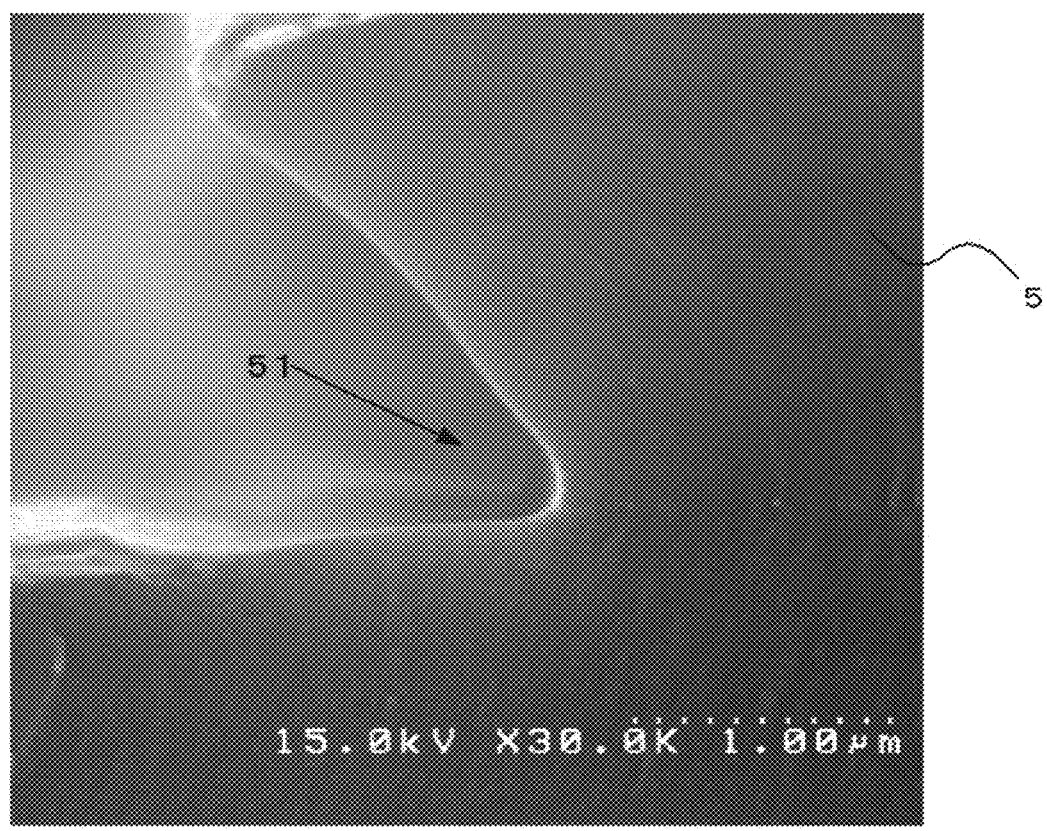
FIG. 6 is a figure showing a cross-sectional SEM image of the step bottom portion on which the to-be-covered portion of Example 3 is not formed.

A SEM image of the cross section of the step bottom portion 51 is shown in FIG. 6. As shown in FIG. 6, the insulation film 4 and the structure 5 contact the step bottom portion 51, whose the curvature radius is very small, i.e. 0.2 micrometers. As a method of increasing the curvature radius of the step bottom portion 51 so as to form a gentle arc shape, alpha-NPD (N,N'-di(1-naphthyl)-N,N'-diphenyl-(1, 1'-biphenyl)-4,4'-diamine), which is known as a hole injection material or a hole transportation material, is used to form a film, and then the assembly is heated to cause flow across the substrate surface.

Figure 7:
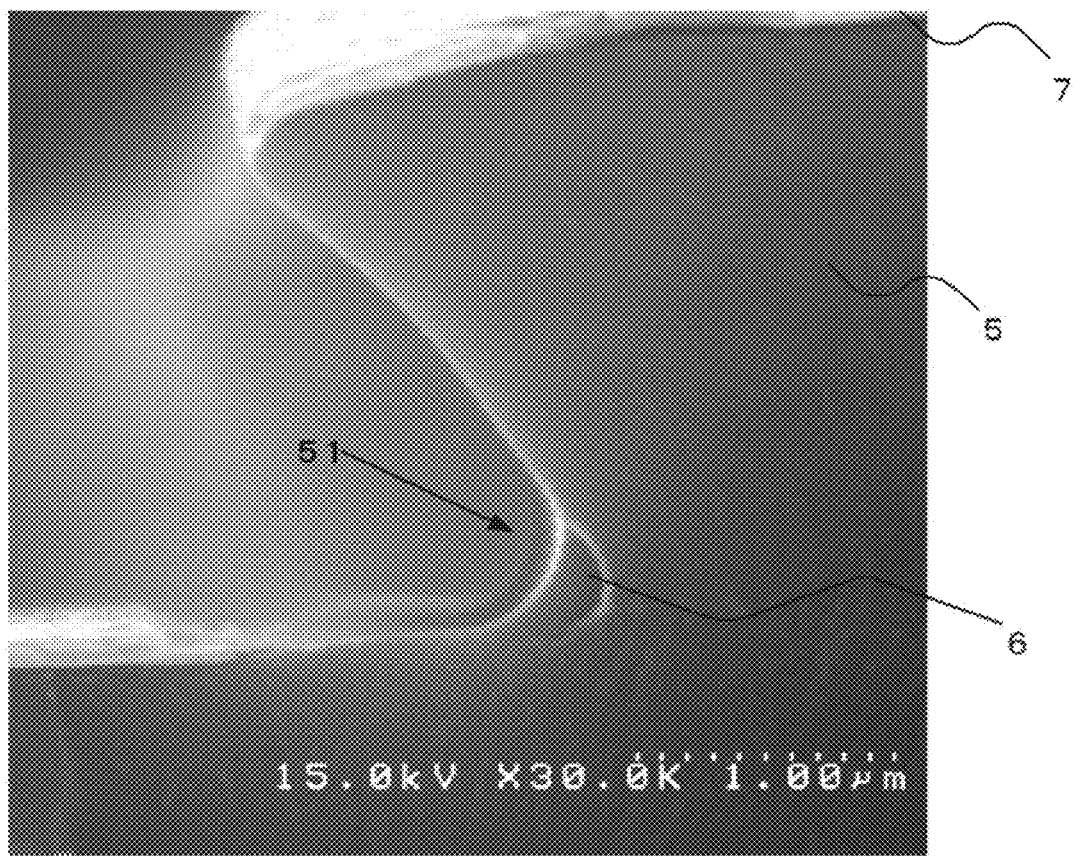
FIG. 7 is a figure showing a cross-sectional SEM image of the step bottom portion on which the to-be-covered portion of Example 3 is formed.
Figure 8:
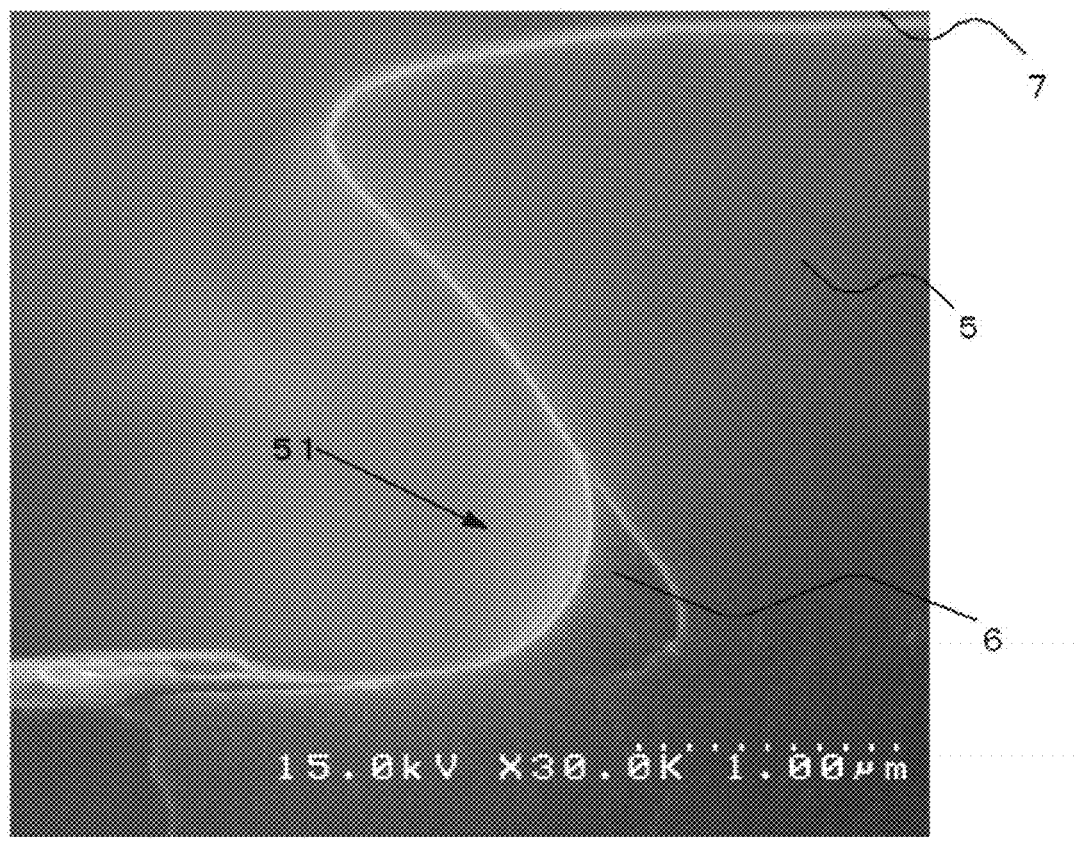
FIG. 8 is a figure showing a cross-sectional SEM image of the step bottom portion on which the to-be-covered portion of Example 3 is formed.
Figure 9:
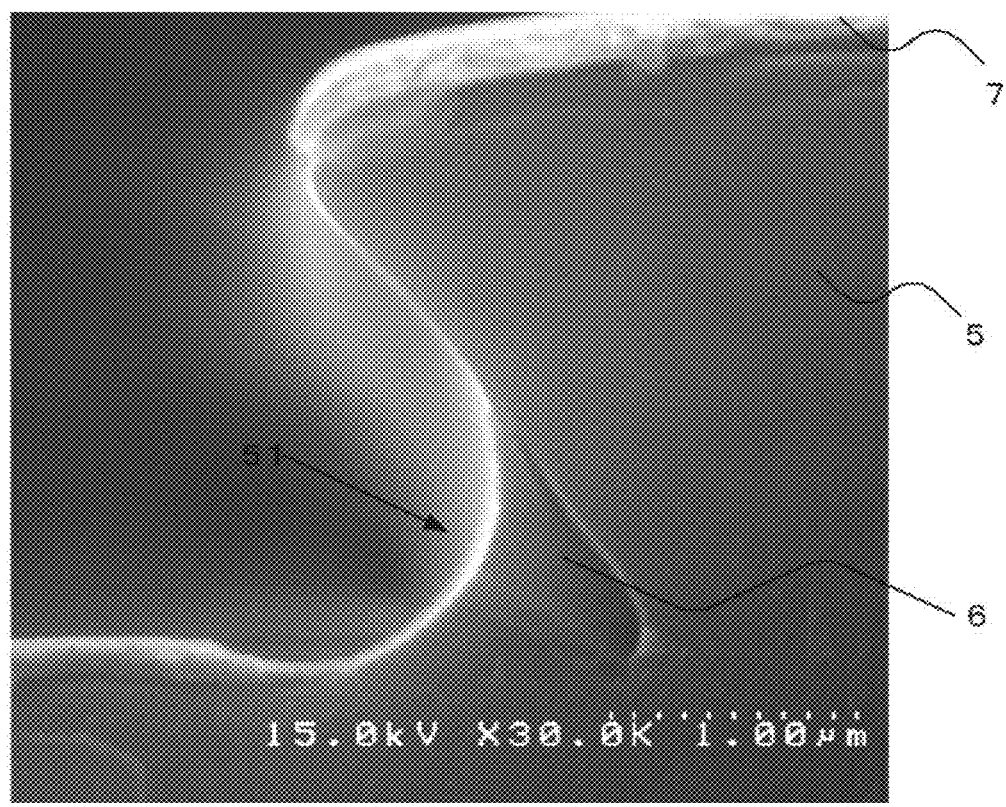
FIG. 9 is a figure showing a cross-sectional SEM image of the step bottom portion on which the to-be-covered portion of Example 3 is formed.

NPD flowed smoothly into the step bottom portion 51, which is the innermost part of the overhang part (structure 5), by appropriate choice of the film thickness, heating temperature and heating time of the NPD, and the curvature radius could also be controlled. The to-be-covered portion 6 was formed such that the curvature radius of the step bottom portion 51 shown in FIG. 7 became 0.4 micrometers, the curvature radius of the step bottom portion 51 shown in FIG. 8 became 0.8 micrometers and the curvature radius of the step bottom portion 51 shown in FIG. 9 became 1.2 micrometers. As shown in the FIGS. 7-9, it was found that the curvature radius was controllable by choice of the film thickness and heating temperature of NPD. Moreover, it was found that, after the NPD film was formed, heating was effective for flowing NPD without breaking vacuum or even after exposure to the atmosphere.

Subsequently, the organic EL element 3 was formed, and further, the passivation film 7 was formed so that the passivation film 7 covered the structure 5, the to-be-covered portion 6, and the organic EL element 3. Finally, the sealing plate was pasted and the preprocessing of the PMOLED panel was finished. Furthermore, the PET film was pealed from the support substrate, divided into individual panel pieces, and the flexible circuit substrate with the IC was mounted to complete the flexible PMOLED (organic EL device 1).

Also in the organic EL device 1 of Example 3, the to-be-covered portion 6 was formed at the step bottom portion 51 of the structure 5, and the passivation film 7 completely covered the structure 5. For this reason, the organic EL device 1 of the Example 3 was resistant to the seepage of adhesive or liquid desiccant into the organic EL element 3, and the organic EL device 1 displayed high reliability. Moreover, when thickness of the passivation film 7 was set to 30 nm-300 nm, even if the flexible PMOLED panel was bent up to 10 mm curvature, no defects were generated.

REFERENCE SIGNS LIST

1. Organic electroluminescence device
2. Substrate
3. Organic electroluminescence element
31. Anode
32. Organic layer
33. Cathode
4. Insulation film
5. Structure
51. Step bottom portion
6. To-be-covered portion
7. Passivation film

The invention claimed is:

1. An organic electroluminescence device comprising:
a substrate;
at least one organic electroluminescence element thereon comprising an anode, an organic layer including an organic light emitting layer, and a cathode;
a longitudinal structure disposed on the substrate, the thickness thereof being thicker than the organic electroluminescence element, and having an overhung structure separating an adjoining electrode;
a to-be-covered portion disposed at a step bottom portion of the longitudinal structure and formed such that the curvature radius of the cross-sectional shape of the to-be-covered portion at the step bottom portion is from 0.3 micrometers to less than the thickness of the longitudinal structure; and
a passivation film covering the organic electroluminescence element, the longitudinal structure and the to-be-covered portion, wherein the cathode is separated by the longitudinal structure.

2. The organic electroluminescence device according to claim 1, further comprising:
a sealing plate or a sealing film that seals the organic electroluminescence element; and
a filled and sealed structure, in which a desiccant is filled, pasted between the organic electroluminescence element and the sealing plate or the sealing film, or a solid sealed structure in which the entire surface of the sealing plate or the sealing film is pasted using an adhesive.

3. The organic electroluminescence device according to claim 1, wherein the to-be-covered portion is a material composing the organic electroluminescence element.

4. The organic electroluminescence device according to claim 3, wherein the to-be-covered portion is a material composing a hole transporting layer or a hole injection layer of the organic electroluminescence element.

5. The organic electroluminescence device according to claim 1, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

6. The organic electroluminescence device according to claim 1,
wherein the longitudinal structure is a cathode separator and has an overhung portion; and
the to-be-covered portion is a positive photoresist material.

7. The organic electroluminescence device according to claim 2, wherein the to-be-covered portion is a material composing the organic electroluminescence element.

8. The organic electroluminescence device according to claim 7, wherein the to-be-covered portion is a material composing a hole transporting layer or a hole injection layer of the organic electroluminescence element.

9. The organic electroluminescence device according to claim 2, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

10. The organic electroluminescence device according to claim 3, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

11. The organic electroluminescence device according to claim 4, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

12. The organic electroluminescence device according to claim 7, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

13. The organic electroluminescence device according to claim 8, wherein the organic electroluminescence device is a passive-matrix type display;
the longitudinal structure is a cathode separator and has an overhung portion; and
the to-be-covered portion is a material composing a hole transporting layer or a hole injection layer of the organic electroluminescence element.

14. The organic electroluminescence device according to claim 2,
wherein the longitudinal structure is a cathode separator and has an overhung portion; and
the to-be-covered portion is a positive photoresist material.

15. A method for manufacturing an organic electroluminescence device comprising a substrate, at least one organic electroluminescence element thereon composing an anode, an organic layer including an organic light emitting layer, and a cathode;
the method comprising:
an anode forming process comprising forming an anode at a predetermined location on the substrate;
a structure forming process comprising forming a longitudinal structure, whose film thickness is thicker than the organic electroluminescence element and which has an overhung structure separating an adjoining electrode, at a predetermined location on the substrate;
a to-be-covered portion forming process comprising forming a to-be-covered portion at a step bottom portion of the longitudinal structure such that the curvature radius of the cross-sectional shape of the to-be-covered portion at the step bottom portion is from 0.3 micrometers to less than the thickness of the longitudinal structure;

an organic electroluminescence element forming process comprising forming an organic electroluminescence element by forming an organic layer and a cathode on the anode; and a passivation film forming process comprising forming a passivation film that covers the organic electroluminescence element, the longitudinal structure and the to-be-covered portion, wherein, in the organic electroluminescence element forming process, the cathode is separated by the longitudinal structure.

16. The method for manufacturing an organic electroluminescence device according to claim 15, wherein, the organic layer includes at least one of a hole injection layer and a hole transporting layer; and the to-be-covered portion forming process comprises:

by film forming, heating and flowing a hole injection material and/or a hole transporting material, forming at least one of a hole injection layer and a hole transporting layer in conjunction with forming the to-be-covered portion at the step bottom portion of the longitudinal structure.

17. The method for manufacturing an organic electroluminescence device according to claim 15, wherein the forming of the to-be-covered portion at the step bottom portion of the longitudinal structure in the to-be-covered portion forming process comprises applying a positive resist and exposing the whole surface.

* * * * *